(12) United States Patent
Iida et al.

(10) Patent No.: US 7,003,970 B2
(45) Date of Patent: Feb. 28, 2006

(54) POWER MODULE AND AIR CONDITIONER

(75) Inventors: Masakazu Iida, Kusatsu (JP); Shinji Ehira, Kusatsu (JP)

(73) Assignee: Daikin Industries, Ltd., Osak (JP)

( * ) Notice: Subject to any disclaimer, the term of this patent is extended or adjusted under 35 U.S.C. 154(b) by 11 days.

(21) Appl. No.: 10/399,749

(22) PCT Filed: Jul. 1, 2002

(86) PCT No.: PCT/JP02/06659

§ 371 (c)(1),
(2), (4) Date: Apr. 22, 2003

(87) PCT Pub. No.: WO03/007376

PCT Pub. Date: Jan. 23, 2003

(65) Prior Publication Data

US 2004/0040327 A1 Mar. 4, 2004

(51) Int. Cl.
F25D 23/12 (2006.01)

(52) U.S. Cl. ............... 62/259.2; 361/704; 361/707

(58) Field of Classification Search .... 62/259.2–259.1, 62/174, 152; 174/254; 361/688, 704, 705, 361/707, 713
See application file for complete search history.

(56) References Cited

U.S. PATENT DOCUMENTS

| | | | | |
|---|---|---|---|---|
| 4,837,129 A | * | 6/1989 | Frisch et al. ............. | 430/319 |
| 5,077,595 A | | 12/1991 | Fukunaga | |
| 5,266,746 A | * | 11/1993 | Nishihara et al. ......... | 174/254 |
| 5,358,604 A | * | 10/1994 | Lin et al. .................. | 216/17 |
| 5,360,942 A | * | 11/1994 | Hoffman et al. .......... | 174/52.4 |
| 5,398,160 A | * | 3/1995 | Umeda ..................... | 361/707 |
| 5,455,738 A | * | 10/1995 | Montesano et al. ...... | 361/707 |
| 5,669,813 A | * | 9/1997 | Jairazbhoy et al. ....... | 454/69 |
| 5,712,540 A | | 1/1998 | Toda et al. | |
| 5,946,192 A | * | 8/1999 | Ishigami et al. .......... | 361/704 |
| 6,108,208 A | * | 8/2000 | Tustaniwskyj et al. .... | 361/705 |
| 6,201,696 B1 | * | 3/2001 | Shimizu et al. .......... | 361/704 |
| 6,396,694 B1 | * | 5/2002 | van den Berg ........... | 361/704 |

FOREIGN PATENT DOCUMENTS

| | | |
|---|---|---|
| EP | 0698769 | 2/1996 |
| JP | 63-93659 U | 6/1988 |
| JP | 4-211200 A | 8/1992 |
| JP | 6-177291 A | 6/1994 |
| JP | 6-77260 U | 10/1994 |
| JP | 10-205937 A | 8/1998 |
| JP | 10-270617 A | 8/1998 |
| JP | 2000-196011 A | 7/2000 |
| JP | 2002-64168 A | 2/2002 |

\* cited by examiner

Primary Examiner—William E. Tapolcai
(74) Attorney, Agent, or Firm—Shinjyu Global IP Counselors, LLP

(57) ABSTRACT

An efficient heat diffusing structure comprising a power module having a mounting substrate that has a high thermal conduction efficiency. The mounting substrate is comprised of a mounting surface on which an electric power circuit for controlling electric power is mounted, and a heat dissipating surface that has a corrugated section formed thereon that serves to dissipate heat. This heat diffusing structure allows the size of the device to be reduced, and also allows costs to be reduced.

23 Claims, 10 Drawing Sheets

POWER MODULE AND AIR CONDITIONER

TECHNICAL FIELD

The present invention relates to a power module and an air conditioner comprising a power module. More particularly, the present invention relates to a heat dissipating structure for improving the heat dissipating efficiency of a power module on which circuit components that generate a great deal of heat are mounted, and the modulization of a power module that uses an inverter circuit to convert commercial ac power to ac power having a predetermined frequency.

BACKGROUND ART

In order to control a device at a predetermined frequency, an inverter circuit will be used to rectify commercial ac power to dc power, and then convert the dc power to ac power that is controlled at a predetermined frequency.

The inverter circuit is formed by combining a rectifying stack, a smoothing condenser, a power transistor, and the like. These circuit components continue to be integrated, and an intelligent module which packages a drive circuit and a power element together is now being marketed. In addition, one type of electric power unit needed to drive the inverter includes a converter that rectifies commercial ac power to dc power, and improves harmonic suppression and efficiency. Moreover, it has been proposed that this electric power unit employs a power switch and the like.

The converter that converts commercial ac power to dc power, and the inverter that converts dc power to ac power of a predetermined frequency, are comprised of heat generating components such as diodes and power switches, and thus must include a heat dissipating structure. For example, it is possible to achieve a cooling effect on the electrical components by using an aluminum substrate to mount the electrical components, due to the cooling effect provided by the surface of the aluminum substrate that is opposite the mounting surface.

However, because the integration of these electrical components continue, a great deal of heat will be generated thereby and the heat dissipating capabilities of the aluminum substrate will be insufficient. Because of this, it is thought that the heat dissipating capabilities will improve by fixing a large number of plate shaped heat dissipating fins onto the bottom surface of the aluminum substrate.

When the heat dissipating plates are added, efficient heat transfer cannot be expected at the connecting surface between the aluminum substrate and the heat dissipating fins because the portion that connects these two elements has a great deal of heat resistance. In order to address this problem, increasing the size of the heat dissipating fins to increase the heat dissipating capacity thereof has been considered. However, this will increase the overall size of the device and make it difficult to lower costs.

It is an object of the present invention to provide a power module that has an efficient heat dissipation structure, that is small, and that allows cost to be lowered.

In addition, because there are many instances in which the converter and inverter are placed in barracks or in specialized modules, the shape of the completed component is large, the thermal design thereof must take into consideration its spatial layout design and thermal state, and the design of the converter and inverter will be extremely difficult.

In addition, a controller for controlling the inverter circuit is comprised of a microcomputer, and the controller and the inverter circuit are connected by a harness or the like. When a drive signal is transmitted via this harness, there is a concern that noise will be easily transferred and be involved in malfunctions.

Furthermore, there are other problems that it is difficult to diagnose a failure part, it is difficult to specify the components to exchange and it is complicate to exchange a component, since the control of the inverter is high efficient.

Because there is a great deal of exposed solder, component lead, and the like for mounting each component, there is also a concern that tracking accidents will occur due to the infiltration of corrosion, dust, or small animals therein.

Operational control of an air conditioner is conducted by controlling the amount of refrigerant that circulates in the refrigerant circuit with the compressor. This type of compressor uses an inverter circuit to control the operational frequency thereof, and thus includes the problems with the inverter circuit described above. In particular, it is desirable for the air conditioner to be made compact by reducing the size of each component therein, and to simplify the layout and thermal design thereof. Furthermore, there is a need to prevent malfunctions due to the effects of noise, as well as a need to prevent the ill effects of corrosion, dust, and the infiltration of small animals therein. In particular, when the inverter circuit is installed in the outdoor unit of an air conditioner, there are concerns about the deterioration thereof that accompanies environmental changes such as temperature variations over a long period of time and wind and rain, and the infiltration of insects and other small animals. The effects of these problems need to be eliminated to the greatest degree possible.

It is another object of the present invention to provide a power module that is constructed such that the portions thereof that are exposed, such as the harness, the solder, and component leads, are reduced to the greatest degree possible, the effects of noise are eliminated, the effects of corrosion, dust, and the infiltration of small animals are eliminated, and special layout and thermal designs are not necessary.

DISCLOSURE OF THE INVENTION

A power module according to claim 1 of the present invention is comprised of a bare chip component that forms an electrical power circuit for controlling electrical power, a mounting substrate on which the bare chip component is mounted, and a molding material formed from an insulating resin that molds to the surface of the mounting substrate on which the bare chip component is mounted.

In the power module according to claim 1 of the present invention, the connection between the bare chip component and the wiring on the mounting substrate can be formed by wire bonding and the like. Because this wiring is covered by means of the molding material, the wiring can be shortened and the effects of noise can be eliminated. In addition, because exposed portions will be eliminated, ill effects from the infiltration of corrosion, dust, and small animals can be prevented.

The power module according to claim 2 of the present invention is the power module disclosed in claim 1, in which a plurality of bare chip components are mounted on the mounting substrate.

In the power module according to claim 2 of the present invention, the connection between the bare chip components and the wiring on the mounting substrate can be formed by wire bonding and the like. Because this wiring is covered by means of the molding material, the wiring can be shortened.

When a large number of components generate heat, the power module can be constructed such that the heat is dissipated via the aluminum substrate.

The power module according to claim 3 of the present invention is the power module disclosed in claims 1 or 2, in which the bare chip component includes an IC chip that is mounted on a printed wiring board that is mounted on the mounting surface.

In the power module according to claim 3 of the present invention, circuit components that produce a great deal of heat can be insulated from those that produce comparatively little heat by forming the printed wiring board on which the comparatively low heat generating circuit components are mounted into a hybrid shape.

The power module according to claim 4 of the present invention is the power module disclosed in claims 1 to 3, in which the mounting substrate has heat dissipating fins that are integrally disposed on the surface opposite the surface on which the bare chip component is mounted.

In the power module according to claim 4 of the present invention, if comparatively high heat generating circuit components are mounted on top of the mounting substrate as bare chip components, heat can be efficiently dissipated therefrom via the heat dissipating fins, and circuit malfunctions can be prevented by maintaining them at a suitable temperature.

The power module according to claim 5 of the present invention is the power module disclosed in claims 1 to 4, and further comprises side walls that are disposed on the edges of the mounting substrate and which extend above the surface on which the bare chip is mounted, and in which a molding material is disposed inside the space formed by the mounting substrate and the side walls.

In this configuration, the task of filling the space formed by the mounting substrate and the side walls with the molding material can be made easy, and the bare chip component mounting surface of the mounting substrate can be accurately covered.

The power module according to claim 6 of the present invention is the power module disclosed in claim 5, in which the side walls are comprised of plate shaped members that are formed from a synthetic resin and in which a conductive pattern is embedded.

Here, it becomes possible to use the conductive pattern embedded in the interior of the side walls to connect the circuit elements, and it also becomes possible to mount circuit elements such as electrolytic condensers and the like that are difficult to integrate.

The power module according to claim 7 of the present invention is the power module disclosed in any of claims 1 to 6, in which the bare chip component includes an inverter circuit that converts commercial ac power to ac power having a predetermined frequency, and a controller that controls the frequency output from the inverter circuit.

Here, by directly mounting the inverter circuit and the controller for the inverter circuit to the mounting substrate as bare chip components and modulizing them, it will not be necessary to again consider the spatial layout and thermal design of each component, the effects of noise will be eliminated to the greatest degree possible by shortening the wiring distances, and the infiltration of corrosion, dust and small animals will be prevented.

The power module according to claim 8 of the present invention is the power module disclosed in claim 7, in which the inverter circuit is comprised of a converter that rectifies commercial ac power to dc power, an inverter that converts the output of the converter to ac power, a converter driver that drives the converter, and an inverter driver that drives the inverter.

Here, each power module can be comprised of one or a plurality of bare chip components, and the bare chip components can be mounted on the aluminum substrate. Thus, it will not be necessary to again consider specialized spatial layout and thermal designs thereof.

The power module according to claim 9 of the present invention is the power module disclosed in claim 7 or 8, in which the inverter circuit controls the electric power supplied to a compressor in an air conditioner, the compressor controlling the amount of refrigerant circulating in a refrigerant circuit.

Here, by modulizing the inverter circuit that controls the compressor of the air conditioner, the size of the device can be reduced, the effects of noise and ill effects from the infiltration of corrosion, dust and small animals can be eliminated, and a highly reliable device can be provided. In addition, by viewing the power module as one component and conducing structural design accordingly, it will not be necessary to have a different structural design for each type of compressor mounted in the air conditioner, and thus the number of man-hours needed for structural design with respect to the large number of different types of compressors available can be greatly reduced.

The power module according to claim 10 of the present invention is the power module disclosed in claim 9, in which the air conditioner is comprised of a fan that produces an air flow that exchanges heat with refrigerant inside a heat exchanger disposed inside the refrigerant circuit, and a fan motor that rotatively drives the fan. In addition, the bare chip component further includes a fan motor controller that controls the rotation of the fan motor.

Here, the size of the device can be reduced by mounting the fan motor controller comprising bare chip components onto the aluminum substrate together with other circuit components and modulizing them, thus eliminating the need to again consider the spatial layout and thermal design thereof.

An air conditioner according to claim 11 of the present invention is comprised of an air conditioning unit that exchanges heat between air drawn therein and refrigerant that circulates inside a refrigerant circuit and then supplies the heat exchanged air to an indoor space, and an electric power unit that controls the electric power supplied to the air conditioning unit. The electric power unit is comprised of a modulized power module that is comprised of a bare chip component that forms an electric power circuit for controlling electric power, an aluminum substrate on which the bare chip component is mounted, and a molding material that is formed from an insulating resin and which molds the surface of the mounting substrate to which the bare chip component is mounted.

Here, by modulizing the electric power unit of the air conditioner, the size of the device can be reduced, the effects of noise and the infiltration of corrosion, dust and small animals can be eliminated, and a highly reliable device can be provided.

The air conditioner according to claim 12 of the present invention is the air conditioner according to claim 11, which further comprises a compressor that controls the amount of refrigerant circulating in the refrigerant circuit, and the bare chip component controls the electric power that is supplied to the compressor and includes an inverter circuit that converts commercial ac power to ac power of a predetermined frequency, and a controller that controls the frequency of the output of the inverter circuit.

Here, the effects of noise can be eliminated by modulizing the electric power unit that serves to control the electric power supplied to the compressor of the air conditioner. In addition, although there is a concern that insects, dust, and the like will infiltrate an indoor unit of a separate type of air conditioner because the outdoor unit thereof is placed outside, foreign objects such as small animals and dust that enter into the electric power unit can be prevented from causing problems such as short circuiting and the like.

The air conditioner according to claim 13 of the present invention is the air conditioner according to claim 11 or 12, in which the air conditioner further comprises a fan that produces an air flow that exchanges heat with refrigerant inside a heat exchanger disposed inside the refrigerant circuit, and a fan motor that rotatively drives the fan. In addition, the bare chip component further includes a fan motor controller that controls the rotation of the fan motor.

Here, the size of the device can be reduced by including and then modulizing the fan motor controller that controls the rotation of the fan motor of the air conditioner, and thus a highly reliable device in which the effects of noise and the infiltration of corrosion, dust, and small animals are eliminated.

A power module according to claim 14 of the present invention has a mounting substrate that is formed from a member having a high thermal conduction efficiency that comprises a mounting surface on which an electric power circuit for controlling electric power is mounted, and a heat dissipating surface on which a corrugated section for heat dissipation is formed.

Here, the heat generated by the circuit components mounted on the mounting surface can be efficiently dissipated by means of the corrugated section formed on the heat dissipating surface of the mounting substrate.

The power module according to claim 15 of the present invention is the power module disclosed in claim 14, in which the mounting surface and the heat dissipating surface form a two-sided mounting substrate.

Here, heat can be efficiently dissipated from the heat dissipation surface even if the mounting surface is molded with an insulating synthetic resin and an enclosed type of module is formed.

The power module according to claim 16 of the present invention is the power module disclosed in claim 14 or 15, in which the mounting substrate comprises a plate shaped substrate formed from an aluminum type of metal and which has a copper wiring pattern formed on one side thereof.

Here, the heat from the circuit components mounted on the mounting surface can be efficiently dissipated because an aluminum type of metal having a high thermo-electric conductivity is used as the mounting substrate.

The power module according to claim 17 of the present invention is the power module disclosed in any of claims 14 to 16, in which heat dissipating fins comprising an attachment surface that attaches to the heat dissipating surface of the corrugated section, and a fin formation section on which plate shaped fins are disposed, are installed on the heat dissipating surface of the mounting substrate.

Here, the attachment surface of the heat dissipating fins has a corrugated shape such that it attaches to the heat dissipating surface of the mounting substrate, and the thermal conductive efficiency between the heat dissipating fins and the mounting substrate is improved. Thus, the heat generated from the circuit components mounted on the mounting substrate can be efficiently transmitted to the heat dissipating fins, and the efficiency of thermal dissipation can be improved.

The power module according to claim 18 of the present invention is the power module disclosed in any of claims 14 to 17, in which the corrugated section is comprised of plate shaped protrusions having rectangular cross-sections and which are formed parallel to each other, and grooves that are formed between adjacent protrusions.

Here, the surface area of the heat dissipating fins of the mounting substrate can be enlarged, and the heat dissipation efficiency can be improved, by means of the protrusions that are rectangular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency thereof is improved.

The power module according to claim 19 of the present invention is the power module disclosed in any of claims 14 to 17, in which the corrugated section is comprised of plate shaped protrusions that are triangular in cross-section and which are formed parallel to each other, and grooves that are formed between adjacent protrusions.

Here, the surface area of the heat dissipating fins of the mounting substrate can be enlarged, and the heat dissipation efficiency can be improved, by means of the protrusions that are triangular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency thereof is improved.

The power module according to claim 20 of the present invention is the power module disclosed in any of claims 14 to 17, in which the corrugated section is comprised of plate shaped protrusions that are trapezoidal in cross-section and which are formed parallel to each other, and grooves that are formed between adjacent protrusions.

Here, the surface area of the heat dissipating fins of the mounting substrate can be enlarged, and the heat dissipation efficiency can be improved, by means of the protrusions that are trapezoidal in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency thereof is improved.

The power module according to claim 21 of the present invention is the power module disclosed in any of claims 14 to 17, in which the corrugated section is comprised of plate shaped protrusions that are semi-circular in cross-section and which are formed parallel to each other, and grooves that are formed between adjacent protrusions.

In the power module according to claim 21 of the present invention, the surface area of the heat dissipating fins of the mounting substrate can be enlarged, and the heat dissipation efficiency can be improved, by means of the protrusions that are semi-circular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency thereof is improved.

The power module according to claim 22 of the present invention is the power module disclosed in any of claims 14 to 17, in which the corrugated section is comprised of a plurality of protrusions having tips thereof that are hemispherical in shape.

Here, the surface area of the heat dissipating fins of the mounting substrate can be enlarged, and the heat dissipation efficiency can be improved, by means of the plurality of protrusions whose tips are hemispherical. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency thereof is improved.

The power module according to claim 23 of the present invention is the power module disclosed in claim 17, in which the heat dissipating surface of the mounting substrate and the attachment surface of the heat dissipating fins comprise protrusions whose tips have a shape in cross-section which bulges outward toward the sides thereof further than the base thereof, and grooves which are received in between adjacent protrusions.

Here, the surface area of the heat dissipating fins of the mounting substrate can be enlarged, and the heat dissipation efficiency can be improved, by means of the protrusions whose tips have a shape in cross-section that bulges outward toward the sides further than the bases thereof, and the grooves are received in between the adjacent protrusions. In addition, by fitting the protrusions and grooves of the respective mounting substrate and heat dissipating fins, movement that separates the two members can be regulated, and thus they can be maintained in the attached state without the use of attachment means such as screws and the like.

BEST MODE FOR CARRYING OUT THE INVENTION (Structure of the Modulized Electric Power Circuit)

The details of a power module according to the present invention will be described with reference to the figures.

Figure 1:
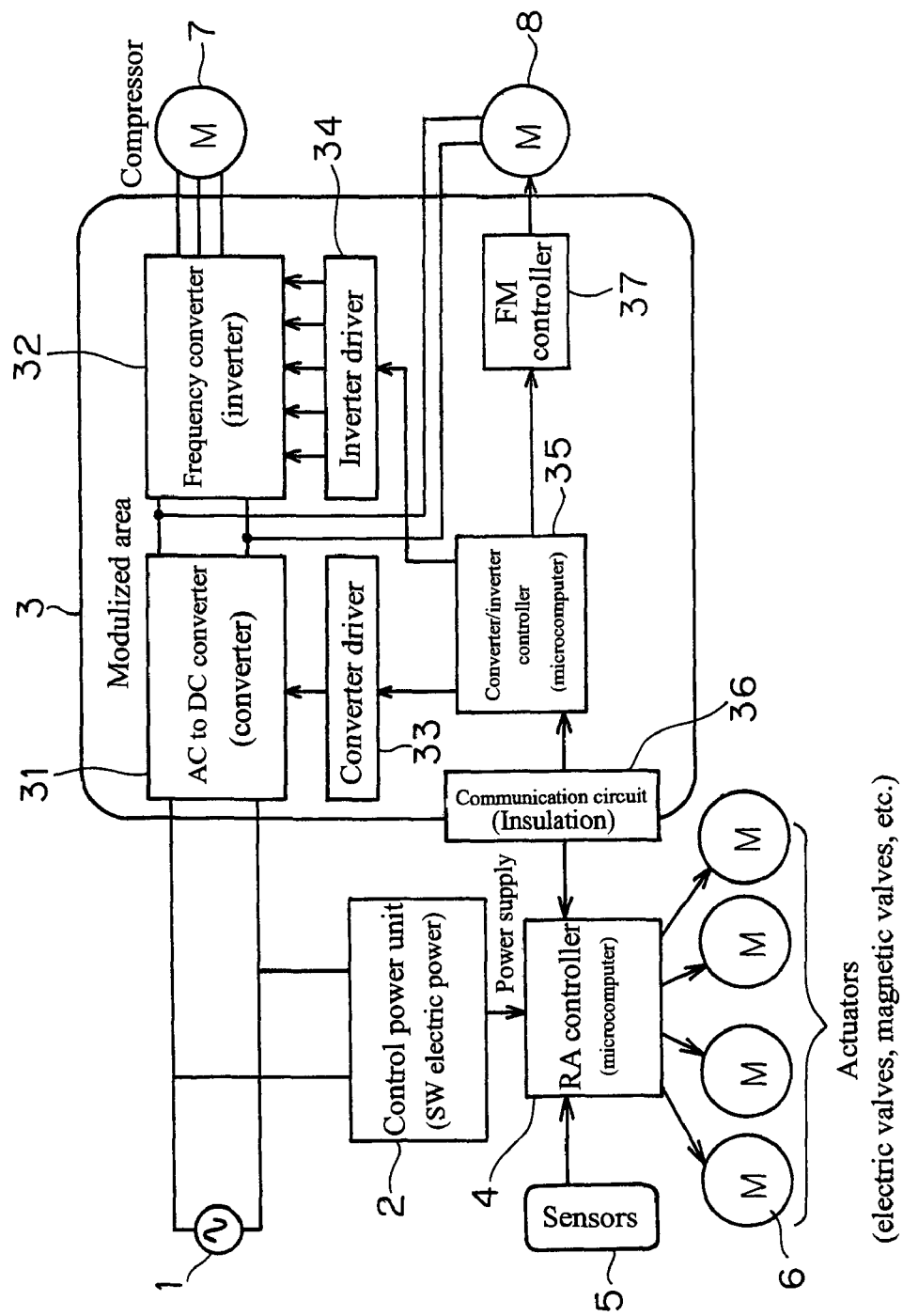
FIG. 1 is a block diagram showing one example of an electrical power circuit for an air conditioner.

FIG. 1 is a block diagram showing an example of an electric power circuit that is employed in an air conditioner.

As shown in FIG. 1, the electric power circuit is connected to a commercial ac power source 1, and the ac power is supplied to a control power unit 2 and a modulized electric power circuit 3.

The control power unit 2 is made up of a switching power supply, and supplies electrical power to a RA controller 4 that includes a microprocessor, ROM, and various types of interfaces. Detection signals from a plurality of sensors 5 are input into the RA controller 4. These sensors 5 include an outside air thermistor that detects the temperature of the outside air, a heat exchange thermistor that detects the evaporation temperature and the condensing temperature of a heat exchanger, a discharge line temperature sensor that detects the discharge line temperature of a compressor, and an intake pressure sensor that detects the intake pressure of a compressor. In addition, a plurality of actuators 6 are connected to and controlled by the RA controller 4, and include an electric expansion valve that is disposed in the refrigerant circuit and serves to reduce the pressure of the refrigerant therein, and a four way directional control valve which serves to switch the operational mode of the refrigerant circuit.

The electric power circuit 3 primarily serves to control the electrical power that drives a compressor 7 and a fan motor 8 in response to the operational state of the air conditioner, and is comprised of a converter 31 that rectifies the ac power supplied from the ac power source 1 and converts it to dc power, an inverter 32 that converts the output of the converter 31 to ac power, a converter driver 33 which serves to drive the converter 31, an inverter driver 34 which serves to drive the inverter 32, a fan motor controller 37 that generates a power supply for driving the fan motor 8, a controller 35 that controls the converter driver 33, the inverter driver 34, and the fan motor controller 37, and a communication circuit 36 which transmits and receives data between the RA controller 4 and the electric power circuit 3.

The converter 31 can be configured as a power switch, and can be configured to include an active filter circuit that outputs dc power at a fixed voltage with respect to the inverter 32.

The fan motor 8 can use an inverter circuit and an inverter driver disposed therein. In this situation, the fan motor 8 is configured such that the output of the converter 31 is supplied thereto, and rotational control thereof occurs based on rotational speed command signals that are input from the fan motor controller 37.

As noted above, the fan motor controller 37 is configured such that it outputs the rotational speed command signals for the fan motor 8. In situations in which the fan motor 8 does not use an inverter circuit disposed therein, it can be configured like the controller for the compressor 7 to include an inverter, and inverter driver, and the like.

The RA controller 4 determines the control variables for each unit in response to the detected values input from the sensors 5 and the current operational mode, outputs control values to the actuators 6, and transmits control variables for the compressor 7 and the fan motor 8 to the controller 35 inside the electrical power circuit 3 via the communication circuit 36.

The controller 35 outputs control values to the converter driver 33, the inverter driver 34, and the fan motor controller 37 based upon the control variables for the compressor 7 and the fan motor 8 transmitted from the RA controller 4. Thus, the operational frequency of the compressor 7 and the rotational frequency of the fan motor 8 can be controlled in response to the operational state of the air conditioner.

Figure 2:
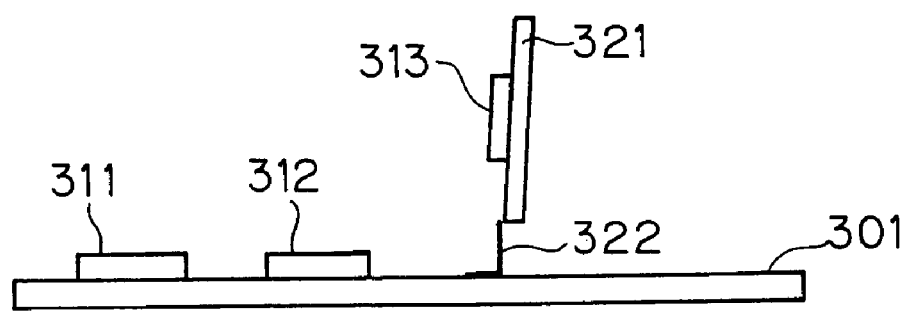
FIG. 2 is a lateral view showing an example of the substrate structure of a power module.

By integrating and modulizing the circuit components, and packaging the heat generating and noise generating components, the controllability of the electric power circuit 3 can be improved, and high performance control thereof can be performed. In other words, as shown in FIG. 2, the electric power circuit 3 is comprised of a plurality of bare chip components 311, 312, and 313 such as a diode and power transistor, smoothing condenser, IC chip, and the like that are each mounted on an aluminum substrate 301 by means of wire bonding, solder, and the like.

The aluminum substrate 301 can, for example, be comprised of a sheet of aluminum nitride having high thermal conductivity and excellent electrical resistance, and a thin sheet of copper that forms a circuit pattern that is adhered to the surface thereof. If a harness is used to connect the controller 35, converter 31, inverter 32, converter driver 33, inverter driver 34, fan motor controller 37 and the communication circuit 36, the harness will be a bundle of connections and will generate emission noise in the same way a coil does. By using an aluminum substrate 301 that is comprised of a thin copper sheet that forms a circuit pattern and an aluminum nitride sheet that has the thin copper sheet applied to the surface thereof, the generation of emission noise can be suppressed, and an increase in controllability due to a reduction in noise can be provided.

Figure 3:
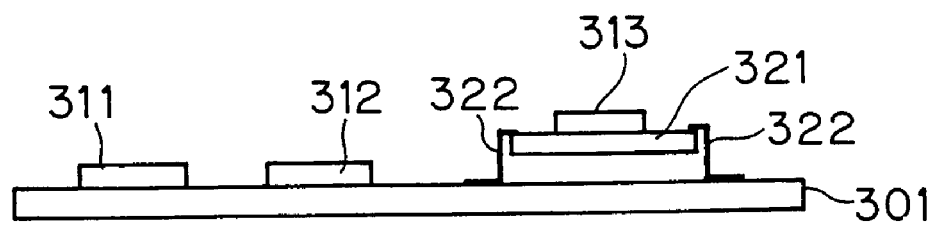
FIG. 3 is a lateral view showing another example of the substrate structure of the power module.

Circuit components that have a high heat output are mounted directly to the aluminum substrate 301, such as the bare chip components 311 and 312. In addition, the bare chip component 313, such as the controller 35 comprised of a one chip microcomputer that includes a microprocessor, ROM, various interfaces, and the like, is to be separated from the temperature load and noise generated by other circuit components and can be mounted on top of a standard printed wiring board 321. A lead 322 provided on the printed wiring board 322 can be mounted on the aluminum substrate 301 by soldering. As shown in FIG. 2, the printed wiring board 321 can be disposed at a right angle to the mounting surface of the aluminum substrate 301, and as shown in FIG. 3, the printed wiring board 321 can also be disposed parallel to the mounting surface of the aluminum substrate 301.

Thus, by mounting precision components such as microcomputers and the like to the printed wiring board 321 in a hybrid manner, unnecessary temperature loads from other circuit components that have high heat outputs can be eliminated, and the effects on noise due to the power switch and the like can be reduced.

The interior of the electric power circuit 3 is a non-insulated structure, and is configured such that the controller 35 transmits data to and receives data from the exterior thereof via the communication circuit 36. Thus, the packaging density of each circuit component can be increased and a reduction in the size of the module can be provided, because the communication circuit 36 insulates the electric power circuit 3 from the exterior thereof and the insulating distance of the module interior is shortened.

As noted above, a molding material that molds both the bare chip components 311, 312 and the bare chip component 313 installed on the mounting surface of the aluminum substrate 301 is provided on top of the aluminum substrate 301.

As shown in FIG. 2, if the printed wiring board 321 is installed on the mounting surface of the aluminum substrate 301 such that it is perpendicular thereto, the molding material can be arranged such that it covers the bare chip components 311, 312 and the lead 322 of the printed wiring board 321 directly installed thereon. In addition, the molding material can also be structured such that one molding material covers bare chip components 311, 312 having equal thicknesses, and another molding material covers only the area around the printed wiring board 321. In this situation, it is preferable that the molding material that covers only the area around the printed circuit board 321 be more adhesive than the molding material that covers the bare chip components 311, 312.

In addition, as shown in FIG. 3, if the printed wiring board 321 is disposed parallel with respect to the mounting surface of the aluminum substrate 301, a molding material can be provided that covers all of the circuit components. Moreover, a molding material can be provided that covers only the bare chip components 311, 312 and the lead 322 provided on the printed wiring board 321. Furthermore, the molding material can also be structured such that one molding material covers bare chip components 311, 312 having equal thicknesses, and another molding material covers only the area around the printed wiring board 321. In this situation also, it is preferable that the molding material that covers only the area around the printed circuit board 321 be more adhesive than the molding material that covers the bare chip components 311, 312.

The molding material is comprised of an insulating synthetic resin. For example, a silicone or epoxy resin can be employed.

The molding material can be applied such that it covers each circuit component mounted on the aluminum substrate 301. However, in order to achieve improved insulation capabilities, a case can be formed on the upper surface of the aluminum substrate 301, and the molding material can be disposed inside the case. An example of this configuration is shown in FIG. 4.

Figure 4:
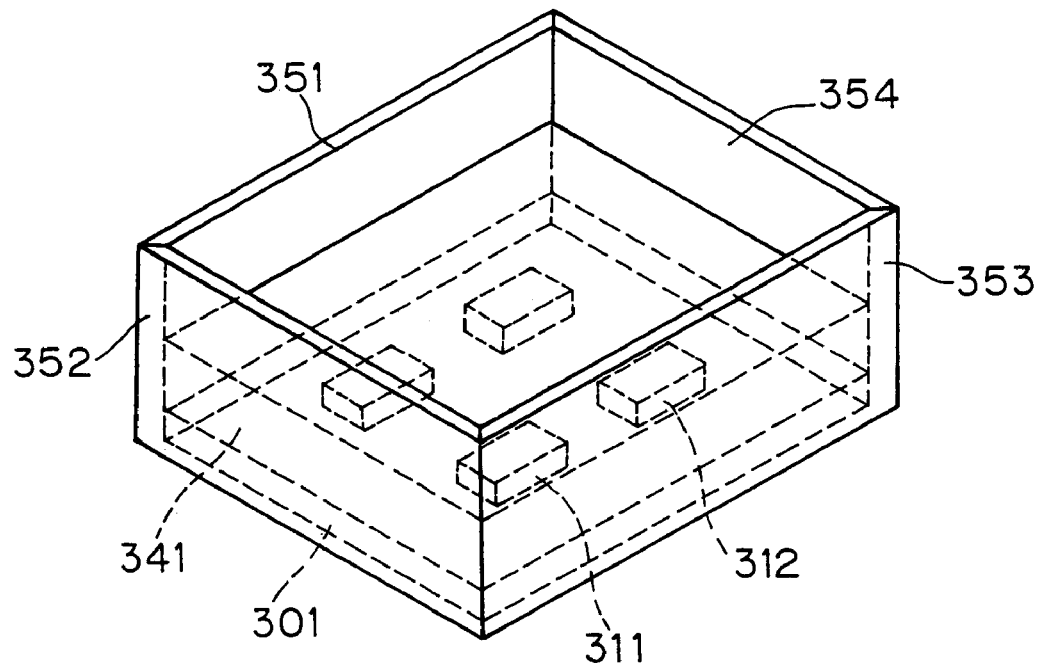
FIG. 4 is a perspective view showing an example of the substrate structure of the power module.

As shown in FIG. 4, side walls 351, 352, 353, 354 are formed on the edges of the aluminum substrate 301 and extend toward the mounting surface side thereof. Side walls 351–354 can be formed from aluminum nitride, like the aluminum substrate 301, or can be formed from an insulating synthetic resin. In addition, the side walls 351–354 are fixed to the respective edges of the aluminum substrate 301 by thermally melting them thereto, adhering them thereto, or the like, and the portions of the side walls 351–354 that are adjacent thereto are fixed to each other by means of thermal melting, adhesives, or the like so that there are no gaps therebetween. Note that it is also possible to unitarily mold the side walls 351–354 such that they are integral with each other.

As noted above, the molding material 341 is disposed in the empty space on the mounting surface side of the aluminum substrate 301 that is formed by the aluminum substrate 301 and the side walls 351–354. The molding material 341 is arranged such that it covers the bare chip components 311, 312, etc. that are mounted on the aluminum substrate 301 as well as their wiring portions.

This configuration prevents the infiltration of corrosion, dust, and small animals therein, and also prevents accidents such as cut wires and short-circuiting. In addition, a frame structure that surrounds the aluminum substrate 301 can be formed with side walls 351–354 that are integrally formed or in which each side is combined with the others, and a case can be formed for mold filling by fixing the side walls 351–354 to the aluminum substrate such that there are no gaps therebetween. Thus, all surfaces of the bare chip components 311, 312, etc. and their wiring portions can be easily covered, and reliability will be improved thereby. Furthermore, a case structure can be achieved by means of the side walls 351–354 and the aluminum substrate 301, and the thickness of the molding can be freely adjusted so that it covers each circuit component to a necessary and sufficient degree. In other words, by using the side walls 351–354 that surround the periphery of the aluminum substrate 301 to prevent the molding material from flowing out, the thickness of the molding material can be freely adjusted.

Figure 5:
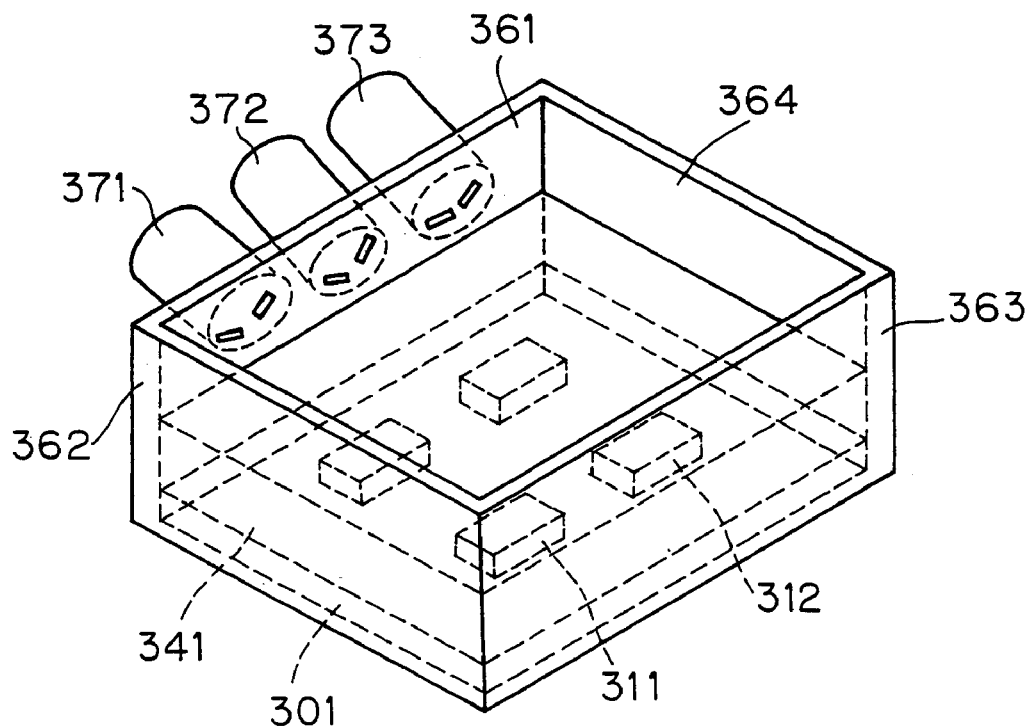
FIG. 5 is a perspective view showing another example of the substrate structure of the power module.

As shown in FIG. 5, side walls 361–364 that are comprised of a synthetic resin in which a conductive pattern formed of copper has been embedded therein can be substituted for the side walls 351–354 shown in FIG. 4.

The side walls 361–364 are formed by inserting a conductive pattern made of copper sheet into a metal mold, and then integrally molding the side walls 361–364 by using a insulating synthetic resin. The side walls 361–364 can also be molded individually, or can be molded so that they are all integral with each other. The side walls 361–364 that are formed in this manner are fixed to the aluminum substrate 301 by means of thermal melting, adhesives, screws, or the like. Preferably, the case is structured such that there are no gaps between the aluminum substrate 301 and the side walls 361–364, and between the portions of the side walls 361–364 that are adjacent to each other.

The molding material 341 is placed into the space on the mounting surface side of the aluminum substrate 301 that is formed by the aluminum substrate 301 and the side walls 361–364. The molding material 341 is disposed such that it covers the bare chip components 311, 312, etc. that are mounted on the aluminum substrate 301 and their wiring portions.

The conductive pattern embedded in the interior of the side walls 361–364 forms a wiring pattern for installing large external circuit components 371–373 such as electrolytic capacitors. Thus, these external circuit components 371–373 can be installed at the proper positions on the side walls 361–364 with solder or the like. FIG. 5 shows an example in which the external circuit components 371–373 are installed on the outer surface of the side wall 361. However, if there is open space above the molding material 341, it is also possible to install the external circuit components on the interior surfaces of the side walls 361–364.

This arrangement makes three dimensional mounting of components possible by mounting the circuit components on the side surfaces of the case of the module, and can increase the integration ratio. In addition, this arrangement can also serve as an installation retention unit for circuit components such as large electrolytic condensers, thereby increasing the integration ratio, and reducing the size of the device.

In this embodiment, it is also possible to substitute a ceramic substrate or the like for the aluminum substrate 301.

(Aluminum Substrate)

If an aluminum substrate is used as the mounting substrate on which bare chip components 311, 312, printed wiring board 321, and the like are mounted, a corrugated section can be disposed on the opposite surface thereof in order to form a heat dissipation surface. Examples of heat dissipation surfaces that are formed by corrugated sections are shown in FIGS. 6 to 10.

Figure 6:
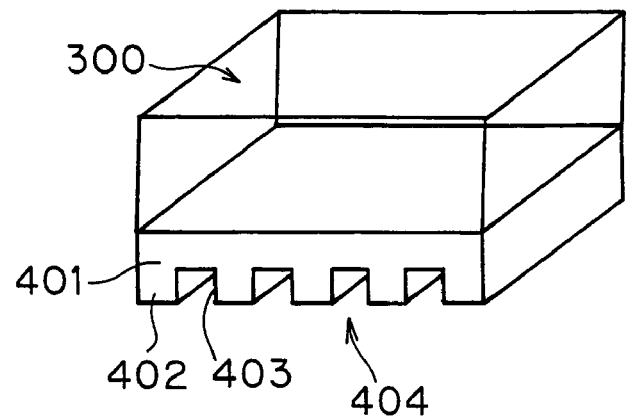
FIG. 6 is a perspective view showing an example of the heat dissipating surface of the aluminum substrate.

An aluminum substrate 401 shown in FIG. 6 has a power module 300 mounted thereon that has, as noted above, been molded from a synthetic resin. A corrugated section 404 comprised of protrusions 402 that are rectangular in cross-section and formed parallel to each other, and grooves 403 that are formed in between adjacent protrusions 402, is formed on the lower surface of the aluminum substrate 401.

The corrugated section 404 has a large surface area and a greatly improved heat dissipation efficiency, because of the protrusions 402 that are rectangular in cross-section and formed parallel to each other, and grooves 403 that are formed in between adjacent protrusions 402.

Figure 7:
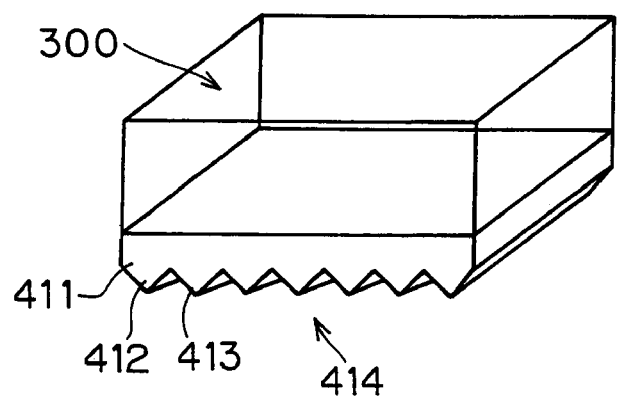
FIG. 7 is a perspective view showing another example of the heat dissipating surface of the aluminum substrate.

An aluminum substrate 411 shown in FIG. 7 has a power module 300 mounted thereon that has, as noted above, been molded from a synthetic resin. A corrugated section 414 comprised of protrusions 412 that are triangular in cross-section and formed parallel to each other, and grooves 413 that are formed in between adjacent protrusions 412, is formed on the lower surface of the aluminum substrate 411.

The corrugated section 414 has a large surface area and a greatly improved heat dissipation efficiency, because of the protrusions 412 that are triangular in cross-section formed parallel to each other, and grooves 413 that are formed in between adjacent protrusions 412.

Figure 8:
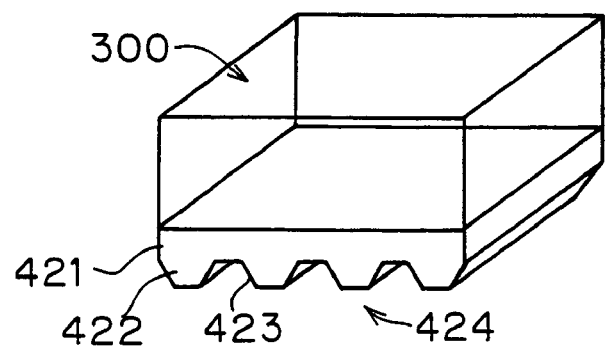
FIG. 8 is a perspective view showing another example of the heat dissipating surface of the aluminum substrate.

An aluminum substrate 421 shown in FIG. 8 has a power module 300 mounted thereon that has, as noted above, been molded from a synthetic resin. A corrugated section 424 comprised of protrusions 422 that are trapezoidal in cross-section and formed parallel to each other, and grooves 423 that are formed in between adjacent protrusions 422, is formed on the lower surface of the aluminum substrate 421.

The corrugated section 424 has a large surface area and a greatly improved heat dissipation efficiency, because of the protrusions 422 that are trapezoidal in cross-section and formed parallel to each other, and grooves 423 that are formed in between adjacent protrusions 422.

Figure 9:
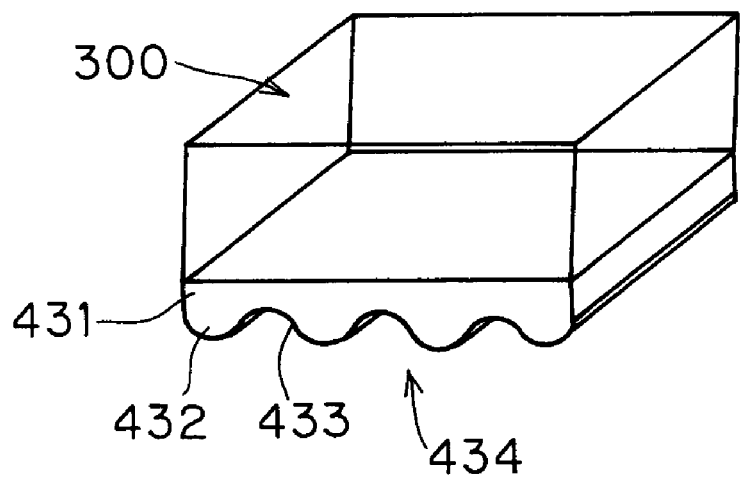
FIG. 9 is a perspective view showing another example of the heat dissipating surface of the aluminum substrate.

An aluminum substrate 431 shown in FIG. 9 has a power module 300 mounted thereon that has, as noted above, been molded from a synthetic resin. A corrugated section 434 comprised of protrusions 432 that are semicircular in cross-section and formed parallel to each other, and grooves 433 that are formed in between adjacent protrusions 432, is formed on the lower surface of the aluminum substrate 431.

The corrugated section 434 has a large surface area and a greatly improved heat dissipation efficiency, because of the protrusions 432 that are semicircular in cross-section and formed parallel to each other, and grooves 433 that are formed in between adjacent protrusions 432.

Figure 10:
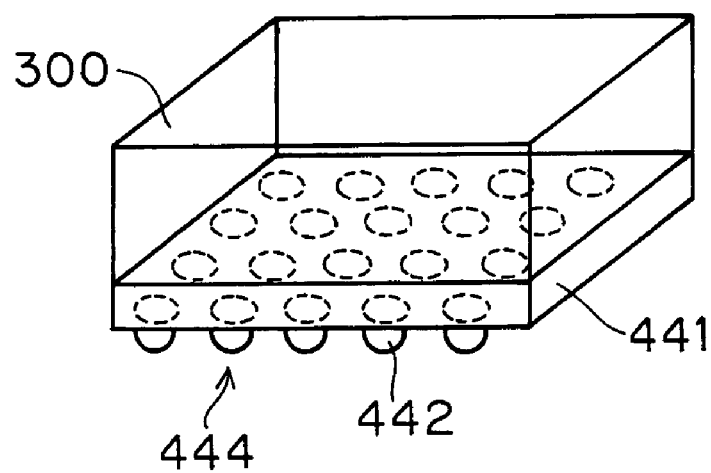
FIG. 10 is a perspective view showing another example of the heat dissipating surface of the aluminum substrate.

An aluminum substrate 441 shown in FIG. 10 has a power module 300 mounted thereon that has, as noted above, been molded from a synthetic resin. A corrugated section 444 comprised of a plurality of protrusions 442 that have a hemisphere formed on each of the tips thereof is formed on the lower surface of the aluminum substrate 441.

The corrugated section 444 has a large surface area and a greatly improved heat dissipation efficiency because of the protrusions 442.

(Heat Dissipating Fins)

Heat dissipating fins that are comprised of an attachment surface which attaches to a corrugated section provided on the lower surface of the aluminum substrate, and a plurality of plate shaped fins, can be installed on the lower surface of the aluminum substrate. Examples of this type of heat dissipating fins are shown in FIGS. 11–15.

Figure 11:
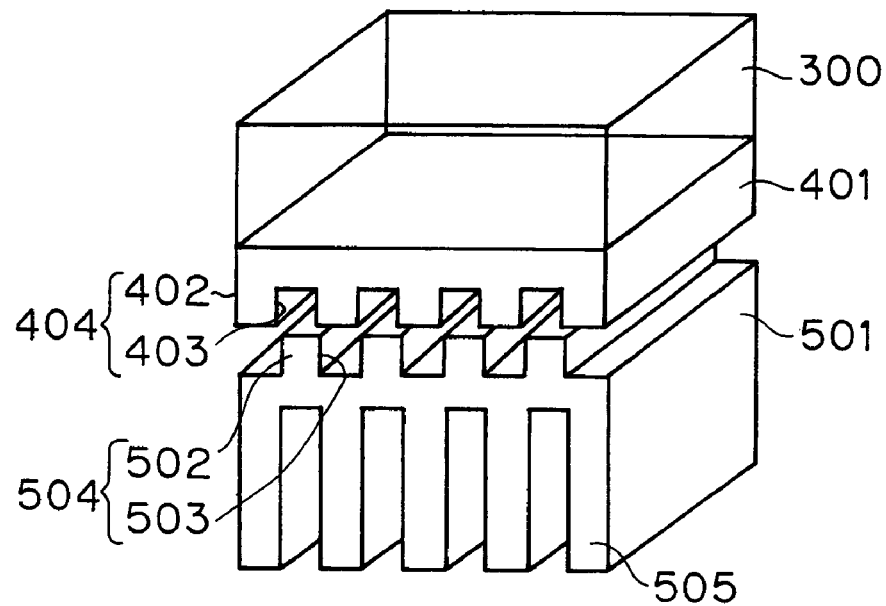
FIG. 11 is a perspective view showing an example of the attachment surface of the heat dissipating fins.

The heat dissipating fins 501 shown in FIG. 11 are installed on the aluminum substrate 401 shown in FIG. 6, and comprise an attachment surface 504 on one side thereof that attaches to the corrugated section 404 of the aluminum substrate 401. The attachment surface 504 is comprised of protrusions 502 that are rectangular in cross-section and fit into the grooves 403 of the aluminum substrate 401, and grooves 503 that accept the protrusions 402 of the aluminum substrate 401. The attachment surface 504 can be adhered to the corrugated section 404 of the aluminum substrate 401.

The heat dissipating fins 501 are comprised of a plurality of plate shaped fin members 505 that project from the side opposite the attachment surface 504. The fin members 505 are formed to be thin in order to enlarge the surface area, and are disposed with a predetermined distance between each other in order to increase the heat dissipation efficiency thereof.

The heat dissipating fins 501, like the aluminum substrate 401, can be comprised of a material such as aluminum nitride having high thermal conductivity and excellent insulation characteristics, and can be produced with a processing method such as drawing or punching.

The heat dissipating fins 501 are attached such that the attachment surface 504 is adhered to the corrugated section 404 of the aluminum substrate 401, and are adhered thereto with an attachment method such as screwing, thermal melting, or by means of a resin material.

When constructed in this manner, there is a large attachment surface area between the corrugated section 404 of the aluminum substrate 401 and the attachment surface 504 of the heat dissipating fins 501, and thus the thermal conduction efficiency from the aluminum substrate 401 to the heat dissipating fins 501 will be excellent, and the heat generated by the power module 300 can be dissipated more efficiently with the fin members 505 of the heat dissipating fins 501.

Figure 12:
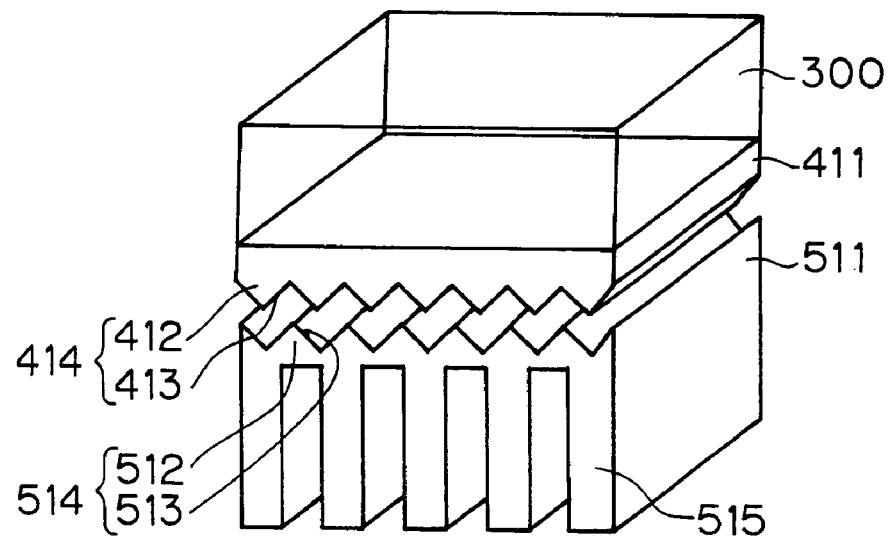
FIG. 12 is a perspective view showing another example of the attachment surface of the heat dissipating fins.

The heat dissipating fins 511 shown in FIG. 12 are installed on the aluminum substrate 411 shown in FIG. 7, and comprise an attachment surface 514 on one side thereof that attaches to the corrugated section 414 of the aluminum substrate 411. The attachment surface 514 is comprised of protrusions 512 that are triangular in cross-section and fit into the grooves 413 of the aluminum substrate 411, and grooves 513 that accept the protrusions 412 of the aluminum substrate 411. The attachment surface 514 can be adhered to the corrugated section 414 of the aluminum substrate 411.

The heat dissipating fins 511 are comprised of a plurality of plate shaped fin members 515 that project from the side opposite the attachment surface 514. The fin members 515 are formed to be thin in order to enlarge the surface area, and are disposed with a predetermined distance between each other in order to increase the heat dissipation efficiency thereof.

The heat dissipating fins 511, like the heat dissipating fins 501 noted above, can be comprised of a material such as aluminum nitride having high thermal conductivity and excellent insulation characteristics, and can be produced with a processing method such as drawing or punching.

The heat dissipating fins 511 are attached such that the attachment surface 514 is adhered to the corrugated section 414 of the aluminum substrate 411, and are adhered thereto with an attachment method such as screwing, thermal melting, or by means of a resin material.

When constructed in this manner, there is a large attachment surface area between the corrugated section 414 of the aluminum substrate 411 and the attachment surface 514 of the heat dissipating fins 511, and thus the thermal conduction efficiency from the aluminum substrate 411 to the heat dissipating fins 511 will be excellent, and the heat generated by the power module 300 can be dissipated more efficiently with the fin members 515 of the heat dissipating fins 511.

Figure 13:
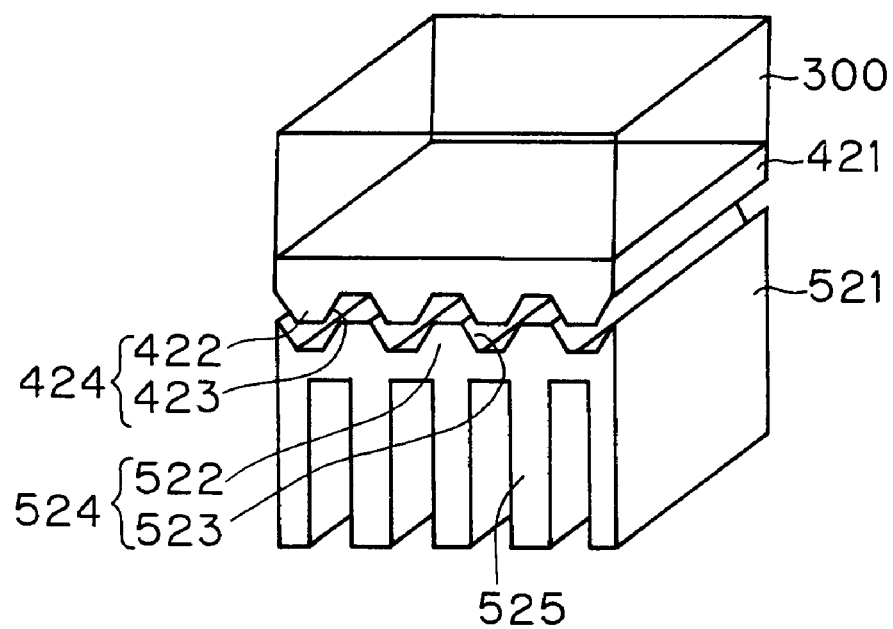
FIG. 13 is a perspective view showing another example of the attachment surface of the heat dissipating fins.

The heat dissipating fins 521 shown in FIG. 13 are installed on the aluminum substrate 421 shown in FIG. 8, and comprise an attachment surface 524 on one side thereof that attaches to the corrugated section 424 of the aluminum substrate 421. The attachment surface 524 is comprised of protrusions 522 that are trapezoidal in cross-section and fit into the grooves 423 of the aluminum substrate 421, and grooves 523 that accept the protrusions 422 of the aluminum substrate 421. The attachment surface 524 can be adhered to the corrugated section 424 of the aluminum substrate 421.

The heat dissipating fins 521 are comprised of a plurality of plate shaped fin members 525 that project from the side opposite the attachment surface 524. The fin members 525 are formed to be thin in order to enlarge the surface area, and are disposed with a predetermined distance between each other in order to increase the heat dissipation efficiency thereof.

The heat dissipating fins 521, like the heat dissipating fins 501 noted above, can be comprised of a material such as aluminum nitride having high thermal conductivity and excellent insulation characteristics, and can be produced with a processing method such as drawing or punching.

The heat dissipating fins 521 are attached such that the attachment surface 524 is adhered to the corrugated section 424 of the aluminum substrate 421, and are adhered thereto with an attachment method such as screwing, thermal melting, or by means of a resin material.

When constructed in this manner, there is a large attachment surface area between the corrugated section 424 of the aluminum substrate 421 and the attachment surface 524 of the heat dissipating fins 521, and thus the thermal conduction efficiency from the aluminum substrate 421 to the heat dissipating fins 521 will be excellent, and the heat generated by the power module 300 can be dissipated more efficiently with the fin members 525 of the heat dissipating fins 521.

Figure 14:
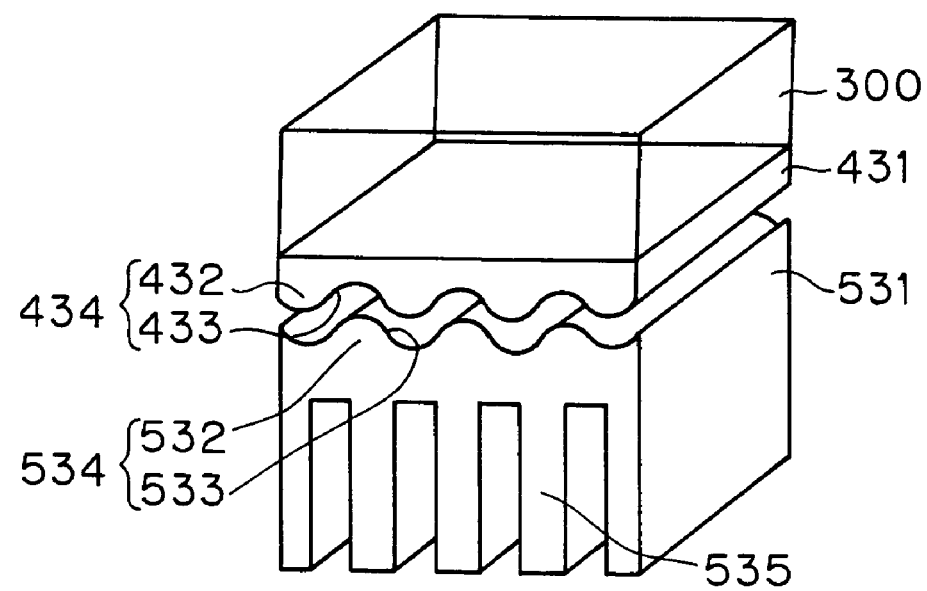
FIG. 14 is a perspective view showing another example of the attachment surface of the heat dissipating fins.

The heat dissipating fins 531 shown in FIG. 14 are installed on the aluminum substrate 431 shown in FIG. 9, and comprise an attachment surface 534 on one side thereof that attaches to the corrugated section 434 of the aluminum substrate 431. The attachment surface 534 is comprised of protrusions 532 that are semicircular in cross-section and fit into the grooves 433 of the aluminum substrate 431, and grooves 533 that accept the protrusions 432 of the aluminum substrate 431. The attachment surface 534 can be adhered to the corrugated section 434 of the aluminum substrate 431.

The heat dissipating fins 531 are comprised of a plurality of plate shaped fin members 535 that project from the side opposite the attachment surface 534. The fin members 535 are formed to be thin in order to enlarge the surface area, and are disposed with a predetermined distance between each other in order to increase the heat dissipation efficiency thereof.

The heat dissipating fins 531, like the heat dissipating fins 501 noted above, can be comprised of a material such as aluminum nitride having high thermal conductivity and excellent insulation characteristics, and can be produced with a processing method such as drawing or punching.

The heat dissipating fins 531 are attached such that the attachment surface 534 is adhered to the corrugated section 434 of the aluminum substrate 431, and are adhered thereto with an attachment method such as screwing, thermal melting, or by means of a resin material.

When constructed in this manner, there is a large attachment surface area between the corrugated section 434 of the aluminum substrate 431 and the attachment surface 534 of the heat dissipating fins 531, and thus the thermal conduction efficiency from the aluminum substrate 431 to the heat dissipating fins 531 will be excellent, and the heat generated by the power module 300 can be dissipated more efficiently with the fin members 535 of the heat dissipating fins 531.

Figure 15:
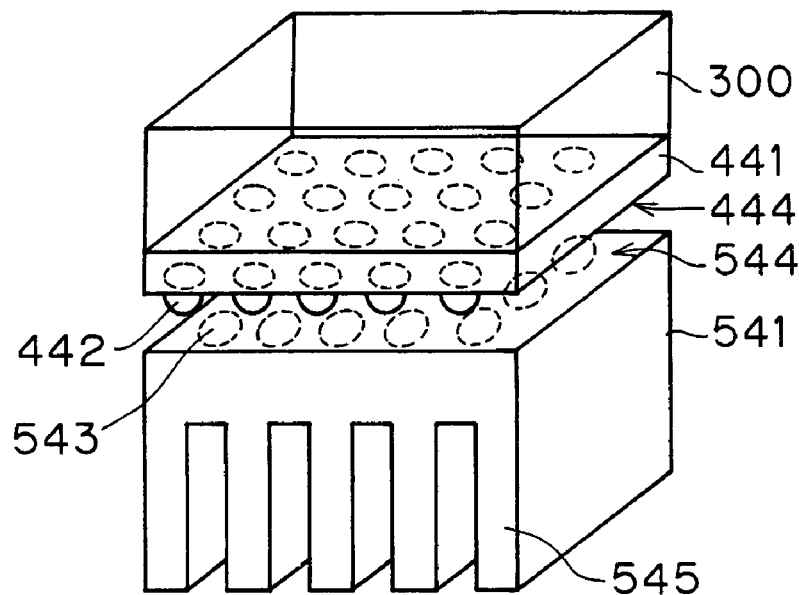
FIG. 15 is a perspective view showing another example of the attachment surface of the heat dissipating fins.

The heat dissipating fins 541 shown in FIG. 15 are installed on the aluminum substrate 441 shown in FIG. 10, and comprise an attachment surface 544 on one side thereof that attaches to the corrugated section 444 of the aluminum substrate 441. The attachment surface 544 is comprised of a plurality of concave portions 543 into which fit the protrusions 442 of the aluminum substrate 441. The attachment surface 544 can be adhered to the corrugated section 444 of the aluminum substrate 441.

The heat dissipating fins 541 are comprised of a plurality of plate shaped fin members 545 that project from the side opposite the attachment surface 544. The fin members 545 are formed to be thin in order to enlarge the surface area, and are disposed with a predetermined distance between each other in order to increase the heat dissipation efficiency thereof.

The heat dissipating fins 541, like the heat dissipating fins 501 noted above, can be comprised of a material such as aluminum nitride having high thermal conductivity and excellent insulation characteristics, and can be produced with a processing method such as drawing or punching.

The heat dissipating fins 541 are attached such that the attachment surface 544 is adhered to the corrugated section 444 of the aluminum substrate 441, and are adhered thereto with an attachment method such as screwing, thermal melting, or by means of a resin material.

When constructed in this manner, there is a large attachment surface area between the corrugated section 444 of the aluminum substrate 441 and the attachment surface 544 of the heat dissipating fins 541, and thus the thermal conduction efficiency from the aluminum substrate 441 to the heat dissipating fins 541 will be excellent, and the heat generated by the power module 300 can be dissipated more efficiently with the fin members 545 of the heat dissipating fins 541.

(Attachment Structure for Aluminum Substrate and Heat Dissipating Fins)

Attachment structures for installing the heat dissipating fins to the heat dissipating surface of the aluminum substrate that are different than the embodiments noted above can be considered. For example, assume that each of the tips of the protrusions provided on the heat dissipating surface of the aluminum substrate have a shape in cross-section that bulges out toward the sides thereof further than the base thereof, and that the shape of each groove positioned between each protrusion allows each protrusion provided on the attachment surface of the heat dissipating fins to be received therein. Further assume that with the protrusions provided on the attachment surface of the heat dissipating fins, each of the tips thereof have a shape in cross-section that bulges out toward the sides thereof further than the base thereof, and that the shape of each groove positioned between each protrusion allows each protrusion provided on the aluminum substrate to be received therein. This configuration allows the aluminum substrate and the heat dissipating fins to be maintained in the attached state even if no screws are used. Embodiments of this configuration are described in FIGS. 16–18.

Figure 16:
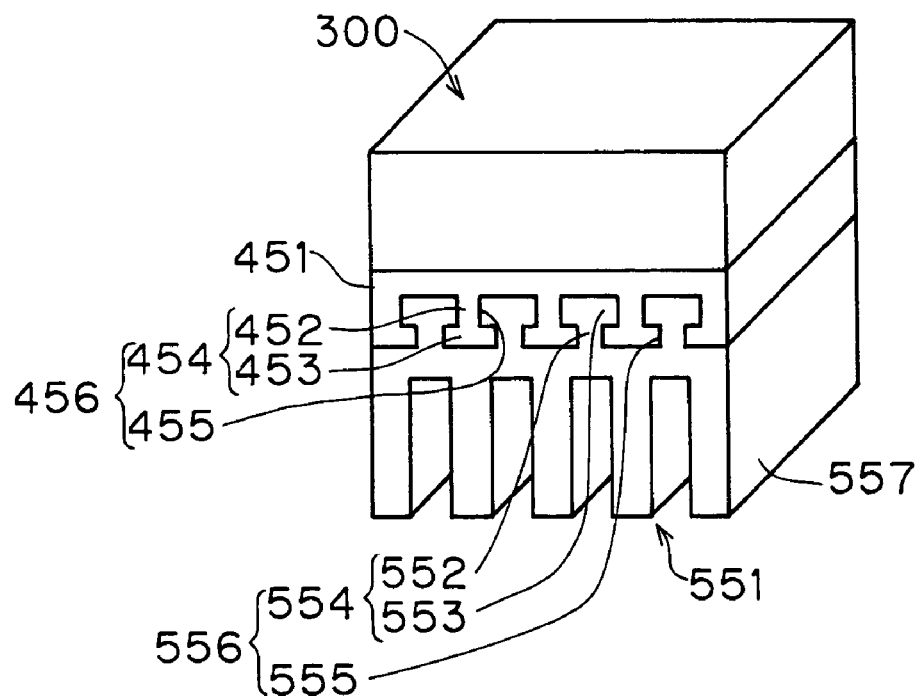
FIG. 16 is a perspective view showing another example of the attachment structure of the aluminum substrate and the heat dissipating fins.

An aluminum substrate 451 shown in FIG. 16 mounts the power module 300 that was molded by means of the synthetic resin noted above. A corrugated section 456 is formed on the lower surface thereof, which comprises protrusions 454 that are formed such that they are parallel with each other, and grooves 455 that are formed between adjacent protrusions 454. Each protrusion 454 is comprised of a base 452 and a tip 453 that bulges out toward the sides further than the base 452, and are T shaped in cross-section.

The heat dissipating fins 551 have, on one surface thereof, an attachment surface 556 that attaches to the corrugated section 456 of the aluminum substrate 451. The attachment surface 556 is comprised of protrusions 554 that fit into the grooves 455 of the aluminum substrate 451, and grooves 555 that receive the protrusions 454 of the aluminum substrate 451. The attachment surface 556 can be adhered to the corrugated section 456 of the aluminum substrate 451. Each protrusion 554 is comprised of a base 552 and a tip 553 that bulges out toward the sides further than the base 552, and are T shaped in cross-section.

The heat dissipating fins 551 are comprised of a plurality of plate shaped fin members 557 that project from the side opposite the attachment surface 556. The fin members 557 are formed to be thin in order to enlarge the surface area, and are disposed with a predetermined distance between each other in order to increase the heat dissipation efficiency thereof.

The heat dissipating fins 557, like the aluminum substrate 451, can be comprised of a material such as aluminum nitride having high thermal conductivity and excellent insulation characteristics, and can be produced with a processing method such as drawing or punching.

The protrusions 454 of the aluminum substrate 451 are fitted into the grooves 555 of the heat dissipating fins 551. By fitting the protrusions 554 of the heat dissipating fins 551 into the grooves 455 of the aluminum substrate 451, and sliding each protrusion 454, 554 parallel to each other, the attachment surface 556 of the heat dissipating fins 551 can be attached to the corrugated section 456 of the aluminum substrate 451.

Thus, by engaging the protrusions 454 and grooves 455 of the aluminum substrate 451 and the protrusions 554 and grooves 555 of the heat dissipating fins 551, movement that separates the aluminum substrate 451 and the heat dissipating fins 551 can be regulated, and thus they can be maintained in the attached state. In this way, the thermal conduction efficiency between the aluminum substrate 451 and the heat dissipating fins 551 can be maintained at a high level, and screws and the like used for installation can be omitted.

Figure 17:
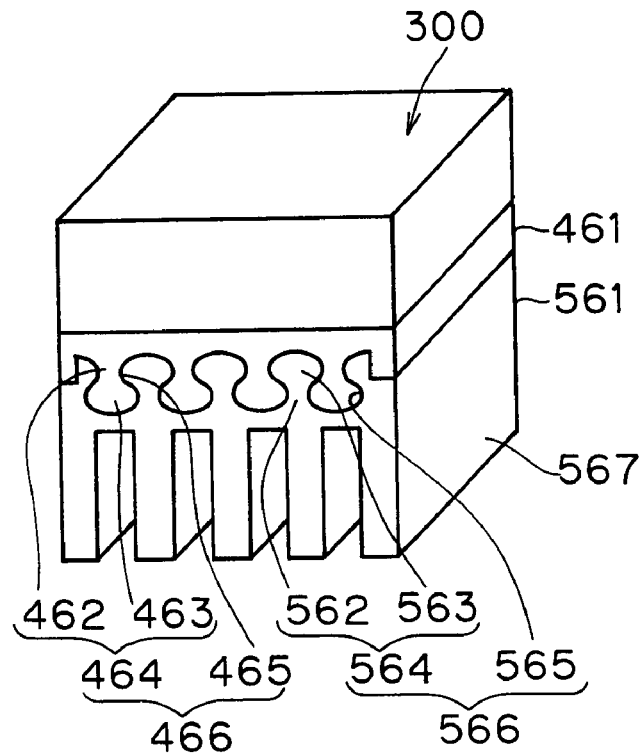
FIG. 17 is a perspective view showing another example of the attachment structure of the aluminum substrate and the heat dissipating fins.

An aluminum substrate 461 shown in FIG. 17 mounts the power module 300 that was molded by means of the synthetic resin noted above. A corrugated section 466 is formed on the lower surface thereof, which comprises protrusions 464 that are formed such that they are parallel with each other, and grooves 465 that are formed between adjacent protrusions 464. Each protrusion 464 is comprised of a base 462 and a tip 463 that bulges out toward the sides further than the base 462. The protrusions 464 and the grooves 465 are shaped such that a cross-section of the corrugated section 466 is a combination of round or elliptical curves.

The heat dissipating fins 561 have, on one surface thereof, an attachment surface 566 that attaches to the corrugated section 466 of the aluminum substrate 461. The attachment surface 566 is comprised of protrusions 564 that fit into the grooves 465 of the aluminum substrate 461, and grooves 565 that receive the protrusions 464 of the aluminum substrate 461. The attachment surface 566 can be adhered to the corrugated section 466 of the aluminum substrate 461. Each protrusion 564 is comprised of a base 562 and a tip 563 that bulges out toward the sides further than the base 562. The protrusions 564 and the grooves 565 are shaped such that a cross-section of the corrugated section 566 is a combination of round or elliptical curves.

The heat dissipating fins 561 are comprised of a plurality of plate shaped fin members 567 that project from the side opposite the attachment surface 566. The fin members 567 are formed to be thin in order to enlarge the surface area, and are disposed with a predetermined distance between each other in order to increase the heat dissipation efficiency thereof.

The heat dissipating fins 567, like the aluminum substrate 461, can be comprised of a material such as aluminum nitride having high thermal conductivity and excellent insulation characteristics, and can be produced with a processing method such as drawing or punching.

Like with the aforementioned embodiment, the protrusions 464 of the aluminum substrate 461 are fitted into the grooves 565 of the heat dissipating fins 561. By fitting the protrusions 564 of the heat dissipating fins 561 into the grooves 465 of the aluminum substrate 461, and sliding each protrusion 464, 564 parallel to each other, the attachment surface 566 of the heat dissipating fins 561 can be attached to the corrugated section 466 of the aluminum substrate 461.

Thus, by engaging the protrusions 464 and grooves 465 of the aluminum substrate 461 and the protrusions 564 and grooves 565 of the heat dissipating fins 561, movement that separates the aluminum substrate 461 and the heat dissipating fins 561 can be regulated, and thus they can be maintained in the attached state. In this way, the thermal conduction efficiency between the aluminum substrate 461 and the heat dissipating fins 561 can be maintained at a high level, and screws and the like used for installation can be omitted.

Figure 18:
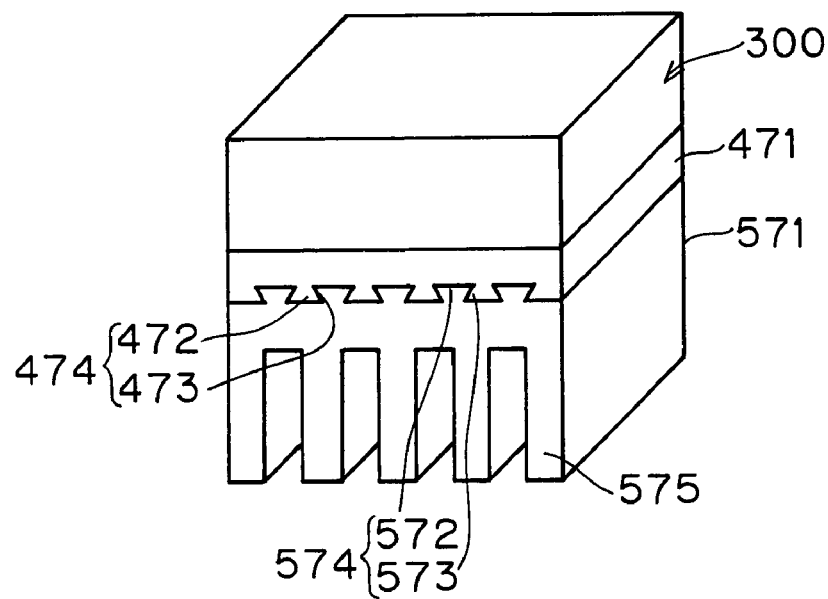
FIG. 18 is a perspective view showing another example of the attachment structure of the aluminum substrate and the heat dissipating fins.

An aluminum substrate 471 shown in FIG. 18 mounts the power module 300 that was molded by means of the synthetic resin noted above. A corrugated section 476 is formed on the lower surface thereof, which comprises protrusions 472 that are formed such that they are parallel with each other, and grooves 473 that are formed between adjacent protrusions 472. Each protrusion 472 is comprised of an upside down trapezoid (in cross-section) that bulges out toward the sides further than the base thereof.

The heat dissipating fins 561 have, on one surface thereof, an attachment surface 574 that attaches to the corrugated section 476 of the aluminum substrate 471. The attachment surface 574 is comprised of protrusions 572 that fit into the grooves 473 of the aluminum substrate 471, and grooves 573 that receive the protrusions 472 of the aluminum substrate 471. The attachment surface 574 can be adhered to the corrugated section 474 of the aluminum substrate 471. Each protrusion 572 is comprised of an upside down trapezoid (in cross-section) that bulges out toward the sides further than the base thereof.

The heat dissipating fins 571 are comprised of a plurality of plate shaped fin members 575 that project from the side opposite the attachment surface 574. The fin members 575 are formed to be thin in order to enlarge the surface area, and are disposed with a predetermined distance between each other in order to increase the heat dissipation efficiency thereof.

The heat dissipating fins 571, like the aluminum substrate 471, can be comprised of a material such as aluminum nitride having high thermal conductivity and excellent insulation characteristics, and can be produced with a processing method such as drawing or punching.

Like with the aforementioned embodiment, the protrusions 472 of the aluminum substrate 471 are fitted into the grooves 573 of the heat dissipating fins 571. By fitting the protrusions 573 of the heat dissipating fins 571 into the grooves 472 of the aluminum substrate 471, and sliding each protrusion 472, 572 parallel to each other, the attachment surface 574 of the heat dissipating fins 571 can be attached to the corrugated section 474 of the aluminum substrate 471.

Thus, by engaging the protrusions 472 and grooves 473 of the aluminum substrate 471 and the protrusions 572 and grooves 573 of the heat dissipating fins 571, movement that separates the aluminum substrate 471 and the heat dissipating fins 571 can be regulated, and thus they can be maintained in the attached state. In this way, the thermal conduction efficiency between the aluminum substrate 471 and the heat dissipating fins 571 can be maintained at a high level, and screws and the like used for installation can be omitted.

The shapes of the corrugated section of the aluminum substrate and the heat dissipating fins are not limited to the shapes shown in the figures, but can be any shape that provides excellent thermal conduction efficiency. In addition, the circuit structure inside the module is not limited to that shown in the figures, and the corrugated section of the aluminum substrate and the heat dissipating fins can be applied to a variety of modules which comprise circuit components that are thought to produce a great deal of heat.

Figure 19:
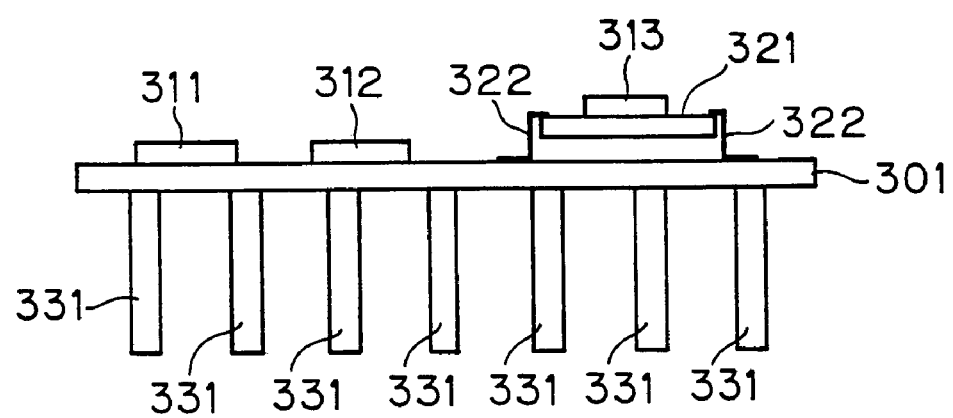
FIG. 19 shows an example in which the heat dissipating fins are disposed on a surface of the aluminum substrate that is opposite the mounting surface thereof.

As shown in FIG. 19, heat dissipating fins 331 can be simply attached directly to the surface opposite the mounting surface of the aluminum substrate 301. The heat dissipating fins 331 can be integrally and simultaneously formed with the aluminum nitride plate that forms the aluminum substrate 301, or can be attached to the aluminum substrate 301 by thermally melting them thereto or adhering them thereto.

If the heat dissipating plates 301 are formed to be integral with the surface opposite the bare chip component mounting surface of the aluminum substrate 301, it will not be necessary to install separate heat dissipating fins, and it will be possible to improve the heat conduction efficiency of the aluminum substrate 301.

INDUSTRIAL APPLICABILITY

In the power module according to claim 1 of the present invention, the connection between the bare chip components and the wiring on the mounting substrate can be formed by wire bonding and the like. Because this wiring is molded by means of the molding material, the wiring can be shortened and the effects of noise can be eliminated. In addition, because exposed portions will be eliminated, the effects from the infiltration of corrosion, dust, and small animals can be prevented.

In the power module according to claim 2 of the present invention, the connection between the bare chip components and the wiring on the mounting substrate can be formed by wire bonding and the like. Because this wiring is molded by means of the molding material, the wiring can be shortened. When a large number of components generate heat, the power module can be constructed such that the heat is dissipated via the aluminum substrate.

In the power module according to claim 3 of the present invention, circuit components that produce a great deal of heat can be insulated from those that produce comparatively little heat by forming the printed wiring board on which the comparatively low heat generating circuit components are mounted into a hybrid shape.

In the power module according to claim 4 of the present invention, if comparatively high heat generating circuit components are mounted on top of the mounting substrate as bare chip components, heat can be efficiently dissipated therefrom via the heat dissipating fins, and circuit malfunctions can be prevented by maintaining them at a suitable temperature.

In the power module according to claim 5 of the present invention, the task of filling the space formed by the mounting substrate and the side walls with the molding material can be made easy, and the bare chip component mounting surface of the mounting substrate can be accurately molded.

In the power module according to claim 6 of the present invention, it is possible to use the conductive pattern embedded in the interior of the side walls to connect the circuit elements, and it is possible to mount circuit elements such as electrolytic condensers and the like that are difficult to integrate.

In the power module according to claim 7 of the present invention, by directly mounting the inverter circuit and the controller for the inverter circuit to the mounting substrate as bare chip components and modulizing them, it will not be necessary to again consider the spatial layout and thermal design of each component, the ill effects of noise will be eliminated to the greatest degree possible by shortening the wiring distances, and ill effects from the infiltration of corrosion, dust and small animals will be prevented.

In the power module according to claim 8 of the present invention, each power module can be comprised of one or a plurality of bare chip components, and the bare chip components can be mounted on the aluminum substrate. Thus, it will not be necessary to again consider the spatial layout and thermal designs thereof.

In the power module according to claim 9 of the present invention, by modulizing the inverter circuit that controls the compressor of the air conditioner, the size of the device can be reduced, the ill effects of noise and the ill effects from the infiltration of corrosion, dust and small animals can be eliminated, and a highly reliable device can be provided. In addition, by viewing the power module as one component and conducing structural design accordingly, it will not be necessary to have a different structural design for each type of compressor mounted in the air conditioner, and thus the number of man-hours needed for structural design with respect to the large number of different types of compressors available can be greatly reduced.

In the power module according to claim 10 of the present invention, the size of the device can be reduced by mounting the fan motor controller comprising bare chip components onto the aluminum substrate together with other circuit components and modulizing them, thus eliminating the need to again consider the spatial layout and thermal design thereof.

In the air conditioner according to claim 11 of the present invention, by modulizing the electric power unit of the air conditioner, the size of the device can be reduced, the ill effects of noise and the ill effects from the infiltration of corrosion, dust and small animals can be eliminated, and a highly reliable device can be provided.

In the air conditioner according to claim 12 of the present invention, the ill effects of noise can be eliminated by modulizing the electric power unit that serves to control the electric power supplied to the compressor of the air conditioner. In addition, foreign objects such as small animals and dust that enter into the electric power unit and cause problems such as short circuiting and the like can be prevented.

In the air conditioner according to claim 13 of the present invention, the size of the device can be reduced by including and then modulizing the fan motor controller that controls the rotation of the fan motor of the air conditioner, and thus a highly reliable device in which the ill effects of noise and the ill effects of the infiltration of corrosion, dust, and small animals are eliminated.

In the power module according to claim 14 of the present invention, the heat generated by the circuit components mounted on the mounting surface can be efficiently dissipated by means of the corrugated section formed on the heat dissipating surface of the mounting substrate.

In the power module according to claim 15 of the present invention, heat can be efficiently dissipated from the heat dissipation surface even if the mounting surface is molded with an insulating synthetic resin and an enclosed type of module is formed.

In the power module according to claim 16 of the present invention, the heat from the circuit components mounted on the mounting surface can be efficiently dissipated because an aluminum having a high thermo-electric conductivity is used as the mounting substrate.

In the power module according to claim 17 of the present invention, the attachment surface of the heat dissipating fins has a corrugated shape such that it attaches to the heat dissipating surface of the mounting substrate, and the thermal conductive efficiency between the heat dissipating fins and the mounting substrate is improved. Thus, the heat generated from the circuit components mounted on the mounting substrate can be efficiently transmitted to the heat dissipating fins, and the efficiency of thermal dissipation can be improved.

In the power module according to claim 18 of the present invention, the surface area of the heat dissipating fins of the mounting substrate can be enlarged, and the heat dissipation efficiency can be improved, by means of the protrusions that are rectangular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency is improved.

In the power module according to claim 19 of the present invention, the surface area of the heat dissipating fins of the mounting substrate can be enlarged, and the heat dissipation efficiency can be improved, by means of the protrusions that are triangular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency is improved.

In the power module according to claim 20 of the present invention, the surface area of the heat dissipating fins of the mounting substrate can be enlarged, and the heat dissipation efficiency can be improved, by means of the protrusions that are trapezoidal in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency is improved.

In the power module according to claim 21 of the present invention, the surface area of the heat dissipating fins of the mounting substrate can be enlarged, and the heat dissipation efficiency can be improved, by means of the protrusions that are semi-circular in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency is improved.

In the power module according to claim 22 of the present invention, the surface area of the heat dissipating fins of the mounting substrate can be enlarged, and the heat dissipation efficiency can be improved, by means of the protrusions that are hemispherical in cross-section and the grooves formed in between the adjacent protrusions. In addition, when the heat dissipating fins are installed, the thermal dissipation effect can be improved because the contact surface area between the heat dissipating surface of the mounting substrate and the attachment surface of the heat dissipating fins is enlarged, and the mutual thermal transmission efficiency is improved.

In the power module according to claim 23 of the present invention, the surface area of the heat dissipating fins of the mounting substrate can be enlarged, and the heat dissipation efficiency can be improved, by means of the protrusions whose tips are shaped in cross-section to bulge outward, with respect to the bases thereof, toward the sides and the grooves are received in between the adjacent protrusions. In addition, by fitting the protrusions and grooves of the respective mounting substrate and heat dissipating fins, movement that separates the two members can be regulated, and thus they can be maintained in the attached state without the use of attachment means such as screws and the like.

The invention claimed is:

1. A power module, comprising:
   a bare chip component that comprises an electrical power circuit for controlling electrical power;
   a mounting substrate including a surface on which the bare chip component is mounted;
   at least two side walls disposed on edges of the mounting substrate and extending above the surface on which the bare chip component is mounted, at least one of the side walls having a conductive pattern embedded therein, the conductive pattern being electrically coupled to the bare chip component, and the conductive pattern forming a wiring pattern with exposed connection points to form one or more external component mounting points for installing large external circuit components at proper positions on the side walls; and
   a molding material including an insulating resin that covers the bare chip component and molds to the surface of the mounting substrate on which the bare chip component is mounted.

2. The power module according to claim 1, wherein a plurality of bare chip components are mounted on the mounting substrate.

3. The power module according to claim 1, wherein the bare chip component includes an IC chip that is mounted on a printed wiring board that is mounted on the mounting substrate.

4. The power module according to claim 1, wherein the mounting substrate comprises heat dissipating fins that are integrally disposed on a surface opposite the surface on which the bare chip component is mounted.

5. The power module according to claim 1, wherein the molding material is disposed inside a space formed by the mounting substrate and the side walls.

6. The power module according to claim 1, wherein at least one of the side walls is formed from a synthetic resin.

7. The power module according to claim 1, wherein the bare chip component comprises an inverter circuit that converts commercial ac power to ac power having a predetermined frequency, and a controller that controls the frequency output from the inverter circuit.

8. The power module according to claim 7, wherein the inverter circuit includes a converter that rectifies commercial ac power to dc power, an inverter that converts the output of the converter to ac power, a converter driver that drives the converter, and an inverter driver that drives the inverter.

9. The power module according to claim 7, wherein the inverter circuit controls electric power supplied to a compressor in an air conditioner, the compressor controlling an amount of refrigerant circulating in a refrigerant circuit.

10. The power module according to claim 9, wherein the air conditioner includes a fan that produces an air flow that exchanges heat with refrigerant inside a heat exchanger disposed inside the refrigerant circuit, and a fan motor that rotatively drives the fan; and
   the bare chip component further includes a fan motor controller that controls rotation of the fan motor.

11. An air conditioner having an air conditioning unit that exchanges heat between air drawn therein and refrigerant that circulates inside a refrigerant circuit and then supplies heat exchanged air to an indoor space, and an electric power unit that controls electric power supplied to the air conditioning unit, the electric power unit comprising:
   a modulized power module including
      a bare chip component including an electric power circuit for controlling electric power;
      a mounting substrate including a surface on which the bare chip component is mounted;
      at least two side walls disposed on edges of the mounting substrate and extending above the surface on which the bare chip is mounted, at least one of the side walls having a conductive pattern embedded therein, the conductive pattern being electrically coupled to the bare chip component, and the conductive pattern forming a wiring pattern with exposed connection points to form one or more external component mounting points for installing large external circuit components at proper positions on the side walls; and a molding material including an insulating resin that covers the bare chip component and molds to the surface of the mounting substrate on which the bare chip component is mounted.

12. The air conditioner according to claim 11, further comprising a compressor that controls the amount of refrigerant circulating in the refrigerant circuit; and the bare chip component being configured to control electric power that is supplied to the compressor and including an inverter circuit that converts commercial ac power to ac power of a predetermined frequency, and a controller that controls an output frequency of the inverter circuit.

13. The air conditioner according to claim 11, further comprising a fan that produces an air flow that exchanges heat with refrigerant inside a heat exchanger disposed inside the refrigerant circuit, and a fan motor arranged to rotate the fan; and the bare chip component further comprises a fan motor controller that controls rotation of the fan motor.

14. A power module, comprising:

a mounting substrate that is formed from a member having a high thermal conduction efficiency and which comprises a mounting surface on which an electric power circuit for controlling electric power is mounted, and a heat dissipating surface on which a corrugated section for heat dissipation is formed, the mounting substrate having side walls, at least one of the side walls having a conductive pattern embedded therein, the conductive pattern being electrically coupled to the electric power circuit, and the conductive pattern forming a wiring pattern with exposed connection points to form one or more external component mounting points for installing large external circuit components at proper positions on the side walls.

15. The power module according to claim 14, wherein the mounting surface and the heat dissipating surface comprise a two-sided mounting substrate.

16. The power module according to claim 14, wherein at least one of the side walls is formed from an aluminum type of metal and the embedded conductive pattern is a copper wiring pattern formed on one side thereof.

17. The power module according to claim 14, further comprising heat dissipating fins comprising an attachment surface that attaches to the heat dissipating surface of the corrugated section, and a fin formation section on which plate shaped fins are disposed.

18. The power module according to claim 14, wherein the corrugated section is comprised of plate shaped protrusions having rectangular cross-sections and which are formed parallel to each other, and grooves that are formed between adjacent protrusions.

19. The power module according to claim 14, wherein the corrugated section includes plate shaped protrusions having triangular cross-sections and which are formed parallel to each other, and grooves that are formed between adjacent protrusions.

20. The power module according to claim 14, wherein the corrugated section includes plate shaped protrusions having trapezoidal cross-sections and which are formed parallel to each other, and grooves that are formed between adjacent protrusions.

21. The power module according to claim 14, wherein the corrugated section includes plate shaped protrusions having semi-circular cross-sections and which are formed parallel to each other, and grooves that are formed between adjacent protrusions.

22. The power module according to claim 14, wherein the corrugated section includes a plurality of protrusions having tips thereof that are hemi-spherical in shape.

23. The power module according to claim 17, wherein the heat dissipating surface of the mounting substrate and the attachment surface of the heat dissipating fins comprise protrusions with tips, each of the tips having a shape in cross-section which bulges outward toward sides of the tip farther than a base of the tip, and grooves which are received in between adjacent protrusions.

* * * * *

UNITED STATES PATENT AND TRADEMARK OFFICE
CERTIFICATE OF CORRECTION

PATENT NO. : 7,003,970 B2  Page 1 of 1
APPLICATION NO. : 10/399749
DATED : February 28, 2006
INVENTOR(S) : Masakazu Iida et al.

It is certified that error appears in the above-identified patent and that said Letters Patent is hereby corrected as shown below:

<u>Title page,</u>
Insert Item -- [30] Foreign Application Priority Data
        July 9, 2001    (JP)    2001-208420
        July 9, 2001    (JP)    2001-208421 --.

Signed and Sealed this

Twentieth Day of June, 2006

JON W. DUDAS
*Director of the United States Patent and Trademark Office*